US011549176B2

(12) United States Patent
Lamouroux et al.

(10) Patent No.: US 11,549,176 B2
(45) Date of Patent: Jan. 10, 2023

(54) METHOD FOR DENSIFYING POROUS ANNULAR SUBSTRATES BY CHEMICAL VAPOUR INFILTRATION

(71) Applicant: SAFRAN CERAMICS, Le Haillan (FR)

(72) Inventors: Franck Lamouroux, Moissy-Cramayel (FR); Rémy Dupont, Moissy-Cramayel (FR); William Ros, Moissy-Cramayel (FR)

(73) Assignee: SAFRAN CERAMICS, Le Haillan (FR)

( * ) Notice: Subject to any disclaimer, the term of this patent is extended or adjusted under 35 U.S.C. 154(b) by 0 days.

(21) Appl. No.: 17/265,378

(22) PCT Filed: Jul. 24, 2019

(86) PCT No.: PCT/FR2019/051829
§ 371 (c)(1),
(2) Date: Feb. 2, 2021

(87) PCT Pub. No.: WO2020/025879
PCT Pub. Date: Feb. 6, 2020

(65) Prior Publication Data
US 2021/0246549 A1 Aug. 12, 2021

(30) Foreign Application Priority Data

Aug. 3, 2018 (FR) ...................................... 1857284

(51) Int. Cl.
*C23C 16/04* (2006.01)
*C23C 16/46* (2006.01)

(52) U.S. Cl.
CPC ............ *C23C 16/045* (2013.01); *C23C 16/46* (2013.01)

(58) Field of Classification Search
CPC .............................. C23C 16/045; C23C 16/46
See application file for complete search history.

(56) References Cited

U.S. PATENT DOCUMENTS 5,480,678 A * 1/1996 Rudolph ................. C04B 35/83
427/248.1
6,630,053 B2 * 10/2003 Yamagishi ........ H01L 21/67173
118/719

(Continued)

FOREIGN PATENT DOCUMENTS

| EP | 1 285 976 A2 | 2/2003 | |
| FR | 2 821 859 A1 | 9/2002 | |
| WO | WO-2007011581 A1 * | 1/2007 | ............. C04B 35/83 |

OTHER PUBLICATIONS

International Search Report as issued in International Patent Application No. PCT/FR2019/051829, dated Oct. 24, 2019.

(Continued)

*Primary Examiner* — Michael B Cleveland
*Assistant Examiner* — Michael G Miller
(74) *Attorney, Agent, or Firm* — Pillsbury Winthrop Shaw Pittman LLP

(57) ABSTRACT

A process for densifying annular porous substrates by chemical vapour infiltration, includes providing a plurality of unit modules including a support plate on which is formed a stack of substrates, the support plate including a central gas inlet opening communicating with an internal volume formed by the central passages of the stacked substrates and gas outlet openings distributed angularly around the central opening, and a thermal mass cylinder disposed around the stack of substrates having a first end integral with the support plate and a second free end, forming stacks of unit modules in the chamber of a densification furnace, and injecting into the stacks of unit modules a gas phase includ- (Continued)

ing a gas precursor of a matrix material to be deposited within the porosity of the substrates.

11 Claims, 5 Drawing Sheets

(56) References Cited

U.S. PATENT DOCUMENTS

| 2004/0071877 | A1 | 4/2004 | Goujard et al. |
| 2004/0237898 | A1 | 12/2004 | Bernard et al. |
| 2007/0014990 | A1 | 1/2007 | Arico et al. |
| 2016/0333470 | A1* | 11/2016 | Kirkpatrick ........... C23C 16/045 |
| 2018/0122677 | A1* | 5/2018 | Dovids ............... H01L 21/6776 |

OTHER PUBLICATIONS

International Preliminary Report on Patentability and the Written Opinion of the International Searching Authority as issued in International Patent Application No. PCT/FR2019/051829, dated Feb. 9, 2021.

* cited by examiner

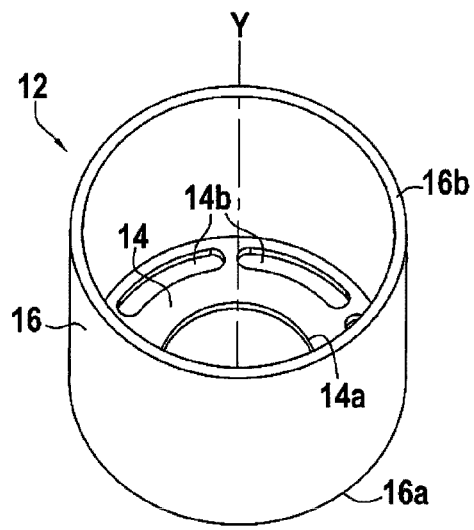
FIG.2
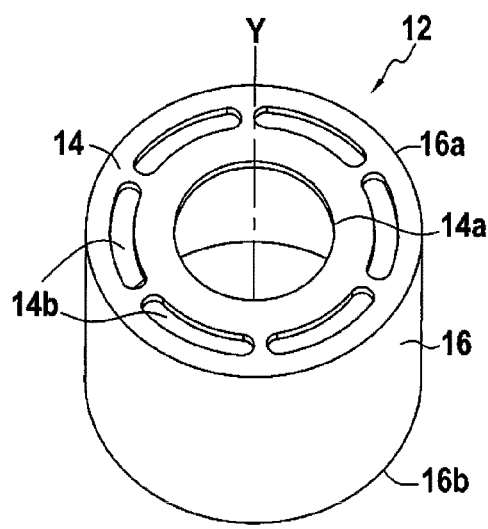
FIG.3
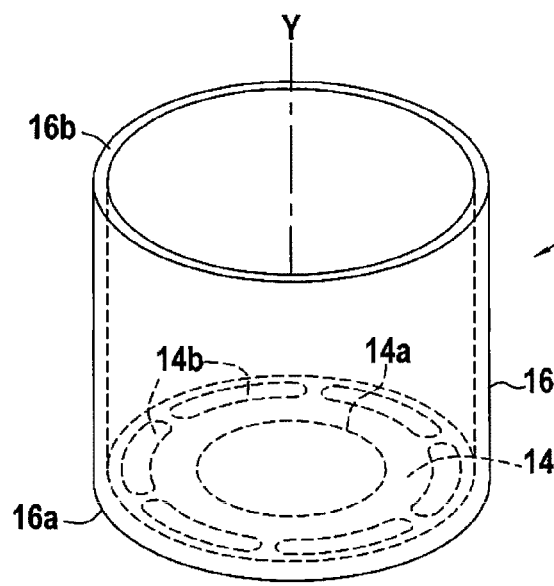
FIG.4A
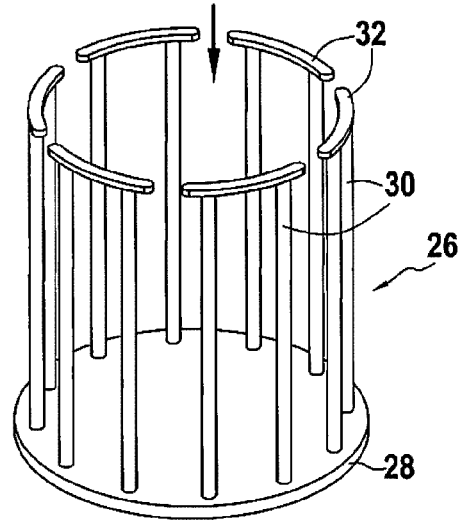

METHOD FOR DENSIFYING POROUS ANNULAR SUBSTRATES BY CHEMICAL VAPOUR INFILTRATION

CROSS-REFERENCE TO RELATED APPLICATIONS

This application is the U.S. National Stage of PCT/FR2019/051829, filed Jul. 24, 2019, which in turn claims priority to French patent application number 1857284 filed Aug. 3, 2018. The content of these applications are incorporated herein by reference in their entireties.

BACKGROUND OF THE INVENTION

The present invention relates to the general field of processes for densifying annular porous substrates by chemical vapour infiltration (CVI). In order to densify such substrates, processes are known in particular in which stacks of substrates are placed in the heated chamber of a densification installation, and a gas phase comprising a matrix material precursor is introduced into the interior of the stacks of substrates so as to form the matrix in the porosity of the substrates. The document FR 2834713 describes such a process and an installation for its implementation.

When a large number of substrate stacks are to be densified, a larger installation is usually used. A known example of a load that can be used in the chamber 1 of a densification furnace is shown in FIG. 1. The chamber 1 is cylindrical around an axis X. The load consists of a plurality of stacks of annular porous substrates 2 carried by a single lower support plate 3. Each stack consists of several sections 4 of stacks superimposed and separated by intermediate support plates 5 common to all stacks. The plates 3 and 5 include openings aligned with central passages in the substrates 2 in order to circulate in each stack a reactive gas phase which then passes through the substrates 2 to densify them. An upper plate 6 sits atop the load and closes the internal volume of each stack. The intermediate support plates 5 are held in place by vertical posts 7.

Such loading has several drawbacks: it is long and complex to perform, temperature gradients may be present within the chamber, and seals between the support plates and stack sections are difficult to guarantee. In addition, it is difficult to control the residence time of the precursor gas that has not been consumed within the chamber, resulting in the formation of undesirable polycyclic aromatic hydrocarbons.

There is thus a need for a chemical vapour infiltration densification process that does not have the above-mentioned disadvantages.

OBJECT AND SUMMARY OF THE INVENTION

The main purpose of the present invention is therefore to overcome such disadvantages by proposing a process for densifying annular porous substrates by chemical vapour infiltration, the process comprising at least the following steps:
providing a plurality of unit modules, each unit module comprising a support plate on which is formed a stack of annular porous substrates, the support plate comprising a central gas inlet opening communicating with an internal volume formed by the central passages of the stacked substrates and gas outlet openings angularly distributed around the central opening, and a thermal mass cylinder disposed around the stack of substrates having a first end integral with the support plate and a second free end,
forming stacks of unit modules in the chamber of a densification furnace, each stack comprising at least one second unit module stacked on a first unit module, the support plate of the second unit module resting on the second free end of the cylinder of the first unit module, the central gas inlet opening of the second unit module communicating with the internal volume of the stack of substrates of the first unit module, and the gas outlet openings of the second unit module communicating with an external volume to the stack of substrates of the first unit module, and
injecting into the stacks of unit modules a gas phase comprising a gas precursor of a matrix material to be deposited within the porosity of the substrates.

Each stack of unit modules thus produced defines a central duct formed by the joining of the internal volumes of the stacks of substrates (said volumes communicate through the central openings of the support plates), and a peripheral duct formed by the joining of the external volumes to the stacks of substrates located inside the unit modules (said volumes communicate through the outlet openings of the support plates). The central duct allows the injected gas to be conveyed inside the stack and over its entire height, while the peripheral duct has the function of recovering and channelling the precursor gas that has passed through the substrates in order to discharge it. The peripheral duct thus defined channels the gases that have not reacted more quickly for their discharge, for example at the level of an outlet opening present in an upper wall of the chamber, which limits their maturation time and reduces the quantity of polycyclic hydrocarbons (PAH) produced per kilogram of carbon deposited within the substrates.

Moreover, the cylinders of each unit module form thermal masses as close as possible to the stacks of substrates, which reduces temperature gradients within the chamber and improves the homogeneity and densification kinetics of the substrates. The reduction in temperature gradients inevitably results in a reduction in densification cycle time and a reduction in the amount of PAH produced. In the prior art, in order to limit the impact on the cycle time of the cooler substrates, the temperature in the chamber is increased in order to obtain an increase in the homogeneous phase kinetics. By implementing a process according to the invention, the return to a more suitable temperature allows a de facto reduction of the PAH rate produced.

In such a process, it is no longer necessary to check for leaks between sections of stacks and intermediate support plates, only between the stacked unit modules, which ensures more uniform densification of the substrates compared with processes involving loading such as that described in the introduction.

Also, the use of large loading plates, often of great thickness, is no longer necessary with the process according to the invention. A gain in terms of loading rate in the chamber is thus obtained.

The use of such unit modules also makes it easier to place the substrates to be densified in the chamber. Indeed, the unit modules can be prepared outside the furnace chamber and then stacked inside the chamber. The formation of a unit module or stacks of unit modules can also be automated.

In an example embodiment, each unit module stack can be supported only by one bottom of the densification furnace chamber. In other words, the stacks of unit modules can be independent of each other.

In an example embodiment, each cylinder can be made of graphite.

In an example embodiment, each unit module can comprise shims between the porous substrates, each shim providing a leakage passage between the internal volume of the stack of substrates and the external volume to the stack of substrates. Thus, the invention applies in particular to so-called forced-flow chemical vapour infiltration processes, in which the gas phase injected into a stack passes through the substrates with the aid of solid shims positioned for example between the substrates, and to so-called semi-forced-flow processes, in which shims providing a leakage passage are disposed between the substrates in order to force only part of the gas phase to pass through the substrates.

In an example embodiment, each stack can be surmounted by a cover closing a volume constituted by the union of the internal volumes of the stacks of substrates of said stack, and comprising openings in communication with a volume constituted by the union of the external volumes of the stacks of substrates of said stack. Said openings may be aligned with the gas outlet openings of a support plate. The cover may have a diameter equal to the diameter of a support plate.

In an example embodiment, each support plate can be circular in shape and have a diameter comprised between 110% and 120% of the outer diameter of an annular porous substrate.

In an example embodiment, to form a stack of annular porous substrates on the support plate of a unit module, arms of a loading device can be inserted into the unit module through the outlet openings of the support plate, the substrate stack can be formed on the ends of the arms inserted into the unit module, and the arms can be removed from the unit module so as to deposit the stack thus formed on the support plate. These additional steps make it easier to form a stack of annular porous substrates on a support plate. These steps can in addition be automated.

In an example embodiment, the chamber of the densification furnace is delimited by a susceptor coupled to an inductor.

In an example embodiment, each annular porous substrate can comprise carbon.

In an example embodiment, each annular porous substrate can constitute a fibrous preform for a brake disc.

BRIEF DESCRIPTION OF THE DRAWINGS

Other features and advantages of the present invention will be apparent from the description made below, with reference to the appended drawings which illustrate an example embodiment devoid of any limiting character. On the figures:

FIGS. 2 and 3 show an example of a structural part used to provide a unit module, FIGS. 4A to 4E illustrate steps to form a stack on the support plate of a unit module.

DETAILED DESCRIPTION OF THE INVENTION

Figure 5:
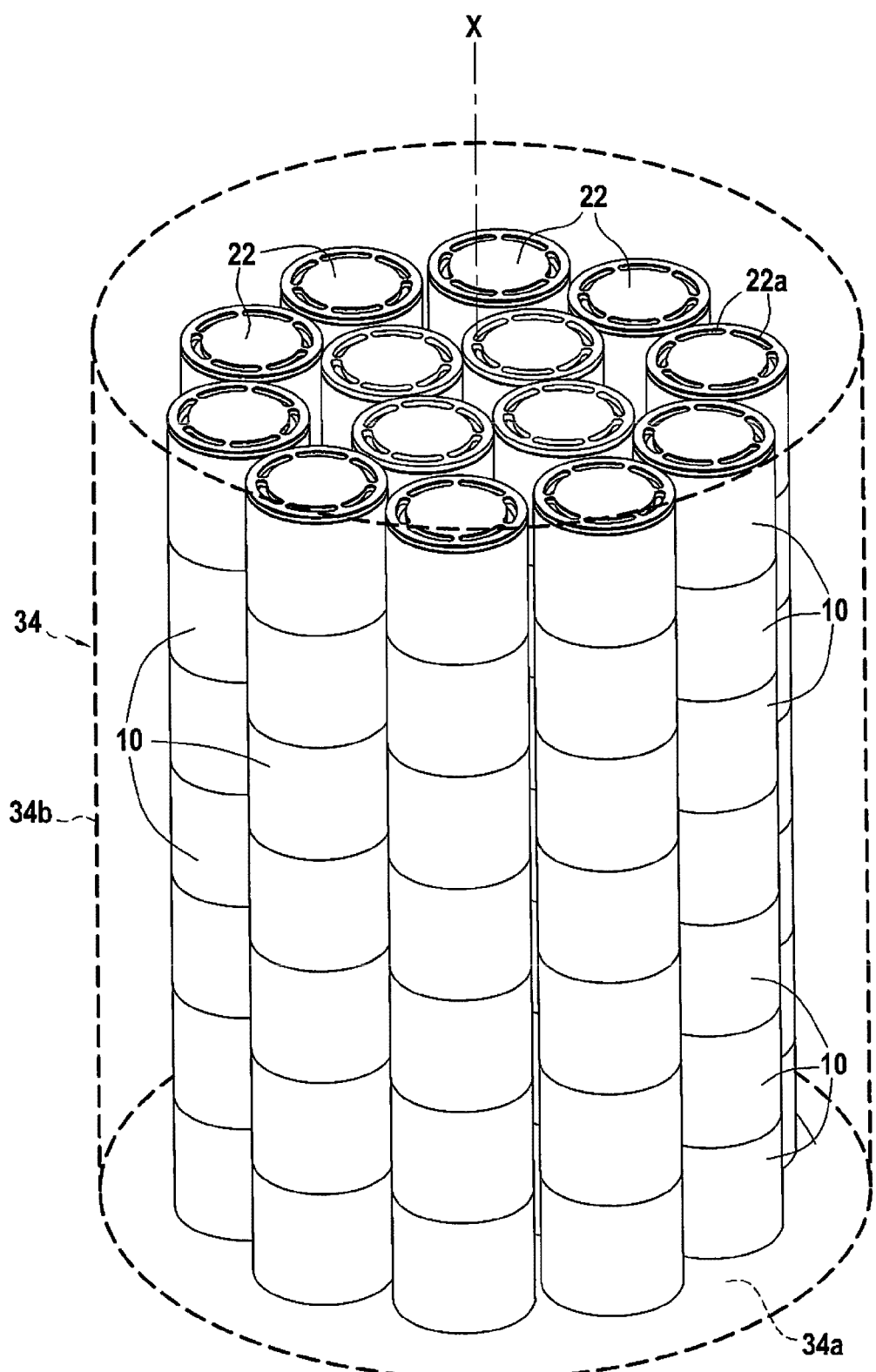
FIG. 5 shows in a highly schematic manner a load made up of stacks of unit modules formed during the implementation of a process according to the invention.
Figure 6:
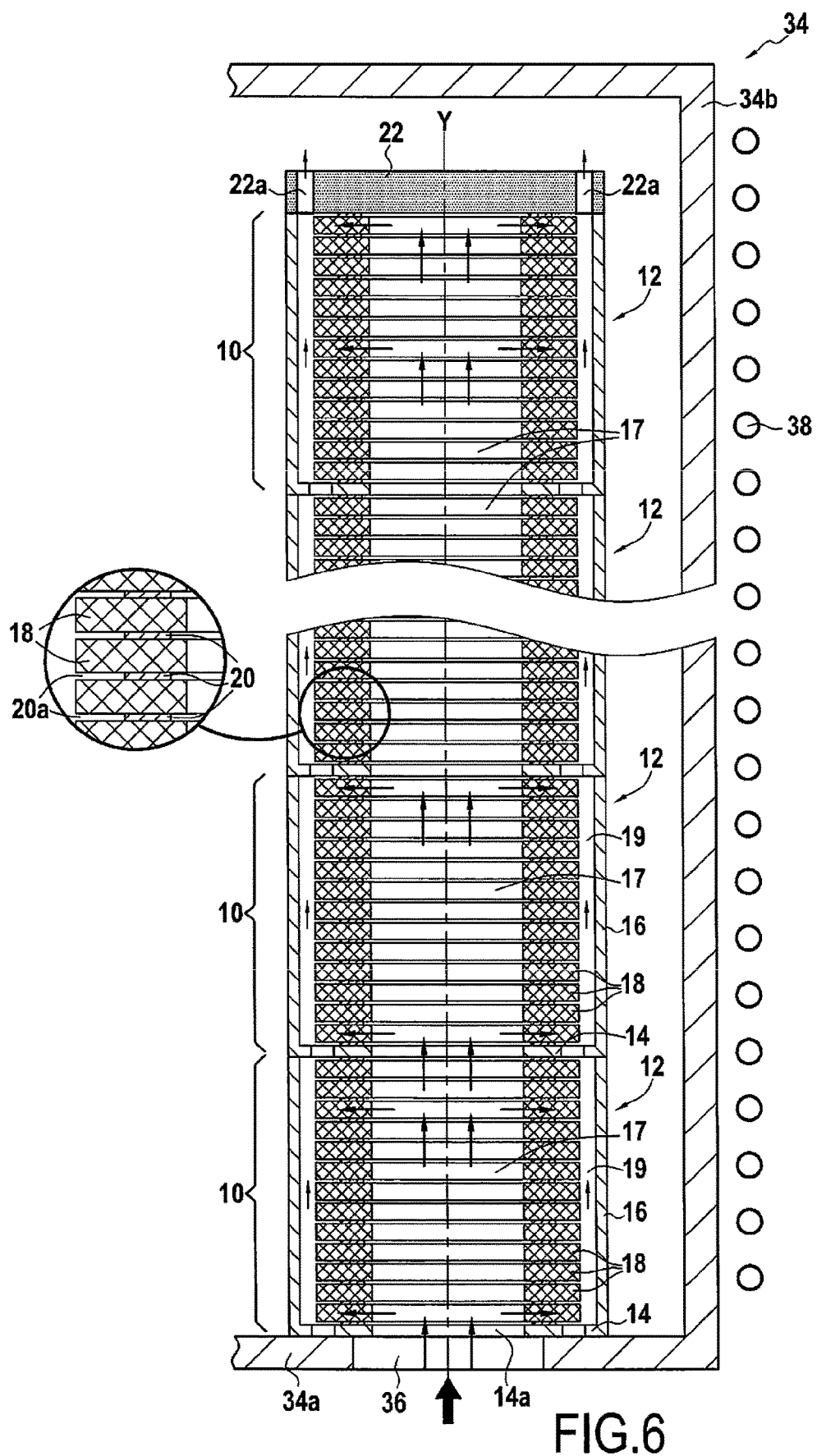
FIG. 6 shows a sectional view of a stack of unit modules inside the chamber of a densification furnace.

A chemical vapour infiltration densification process according to the invention comprises, first, a step during which a plurality of unit modules 10 are provided (FIGS. 5 and 6).

A unit module 10 first comprises a structural part 12 (FIGS. 2 and 3) comprising a support plate 14 with a central gas inlet opening 14a and gas outlet openings 14b distributed angularly around the central opening 14a. The support plate 14 is here in the form of an openwork disc. The gas outlet openings 14b form a crown around the central gas inlet opening 14a, i.e., they describe a circle around the central gas inlet opening 14a. The support plate 14 here has six gas outlet openings 14b. The structural part 12 further comprises a cylinder 16 that extends vertically from the support plate 14 and is integral therewith. The cylinder 16 thus comprises a first end 16a integral with the support plate 14, and a second free end 16b. The support plate 14 and the cylinder 16 are centred on an axis Y. The structural part 12 can be made of graphite in order to recover the heat for example from an inductor which provides the heating of the chamber to restore it by radiation.

A unit module 10 is then produced by forming a stack of annular porous substrates 18 on the support plate 14 of the structural part 12. Each annular porous substrate 18 has a central passage 18a. In general, the annular porous substrates 18 are stacked on the support plate 14 in such a way that the central inlet opening 14a communicates with an internal volume 17 formed by the central passages 18a of the stacked substrates 18, and the gas outlet openings 14b communicate with an external volume 19 to the stack of substrates 18, the external volume 19 being circumscribed inside the cylinder 16. The porous substrates 18 and the part 12 are centred on the same axis Y. In this example, the substrates 18 have a smaller outer diameter than the support plate 14. In particular, the diameter of the support plate 14 can be comprised for example between 110% and 120% of the outer diameter of a substrate 18. The diameter of the gas inlet opening 14a can be of the order of the diameter of a central passage 18a of a porous substrate 18.

In the example shown, a porous substrate 18 is separated from an adjacent substrate or the support plate 14 by one or more spacing shims 20 that define intervals 20a (FIG. 6). The shims 20, for example disposed radially with respect to the axis Y of a module 10, and are arranged to form passages connecting the internal volume 17 stacked with the external volume 19.

The passages provided by the shims 20 may offer a relatively restricted passage section so as to allow the existence of a pressure gradient between the volumes 17 and 19, as described in the patent application FR 2821859, then referred to as densification by forced-flow CVI (almost zero passage section) or semi-forced CVI (non-zero passage section). Thus, each unit module 10 comprises, in the example shown, a stack of substrates 18 between which are present shims 20, the stack of substrates 18 being placed on a shim 20 in contact with the support plate 14, and being surmounted by a shim 20 intended to be in contact with another unit module 10 or a cover 22 (FIGS. 5 and 6). The length of the cylinder 16 here is such that its free end 16b ends at the same level as the upper surface of the last shim 20.

The substrates 18 are for example carbon fibre preforms or blanks made of pre-densified preforms, intended for the production of brake discs made of carbon/carbon (C/C) composite material by densification with a pyrolytic carbon matrix.

The design of a unit module 10 according to the invention makes it possible to form a stack of substrates 18 on a support plate 14 in a simple and automatable manner. An example of the sequence of steps to form a stack of substrates 18 on the support plate will be described in connection with FIGS. 4A to 4E.

First, a loading device 26 can be provided, comprising a disc-shaped lower plate 28 from which vertical arms 30 extend. The vertical arms 30 are disposed in a circle near the circumference of the lower plate 28 and positioned so that they can be inserted into the gas outlet openings 14b of the support plate 14 of a structural part 12. In the example shown, two adjacent vertical arms are connected at their opposite end to the lower plate 28 by a stack support element 32 which here describes an arc of a circle. The shape of stack support element 32 may correspond to the shape of a gas outlet opening 14b.

A first step (FIG. 4A) consists in positioning the loading device 26 under the structural part 12 so that the vertical arms 30, and more precisely the stack support elements 32, are each facing an outlet opening 14b.

Then, the arms 30 are inserted into the outlet openings 14b (FIG. 4B) until the lower plate 28 abuts against the support plate 14. If need be, a shim 20 may have already been positioned on the support plate 14 before inserting the arms 30. In the example shown, the structural part 12 is held by means not shown independent of the loading device 26 so that it remains stationary and only the loading device 26 moves relative to the structural part 12.

Figure 1:
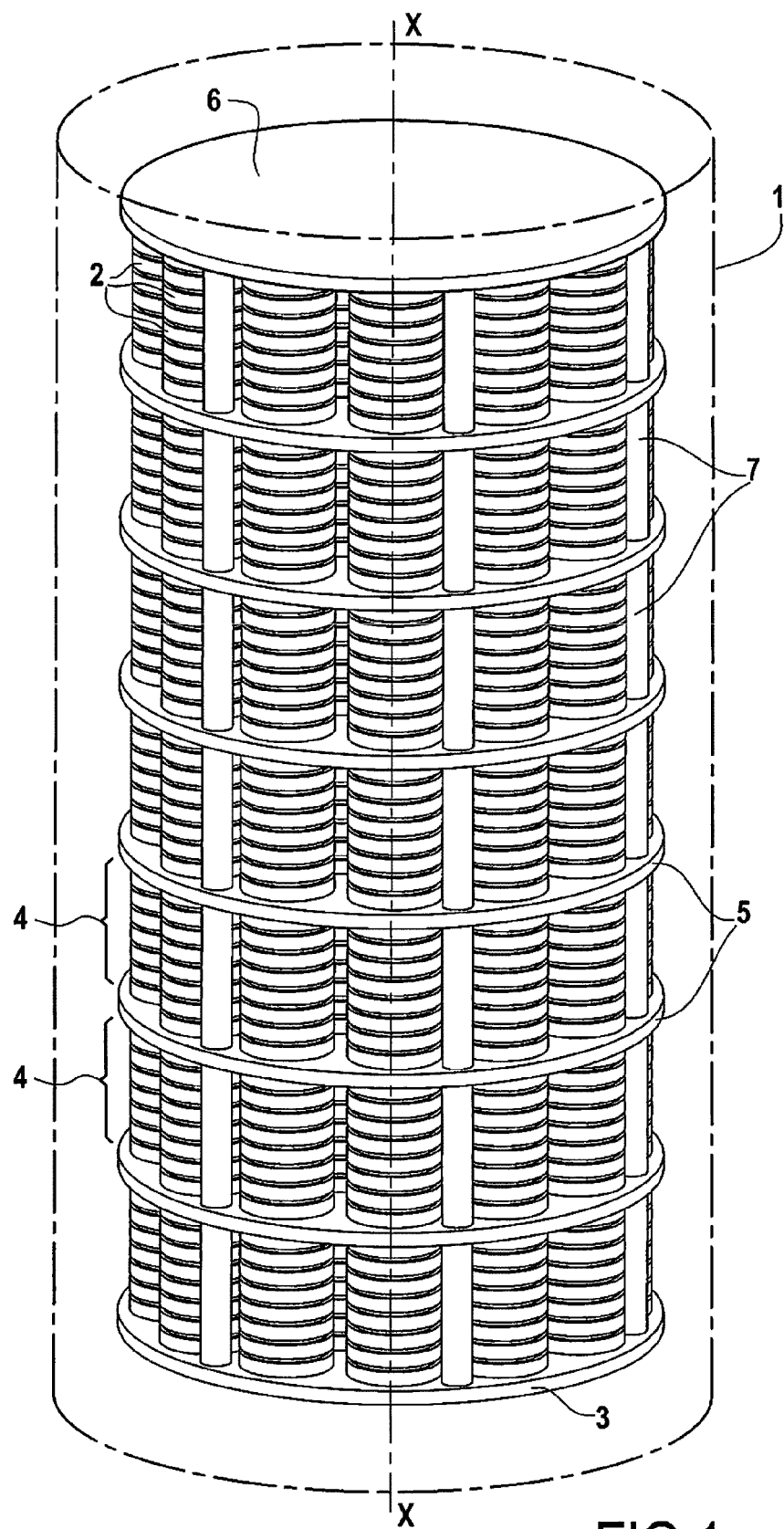
FIG. 1 shows in a highly schematic manner an example of loading of annular porous substrates according to the prior art.
Figure 4B:
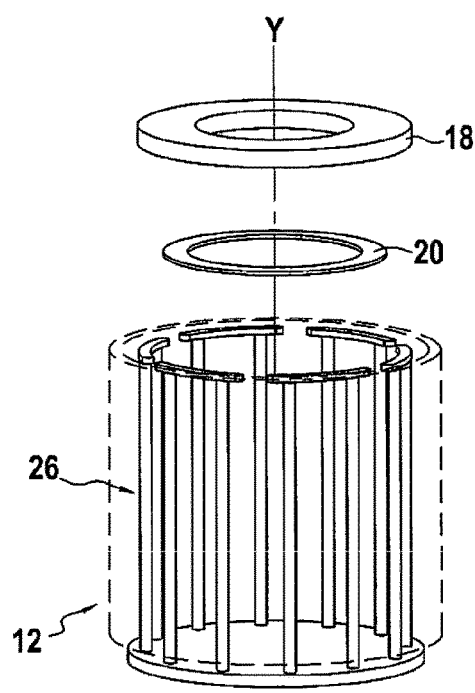
Figure 4C:
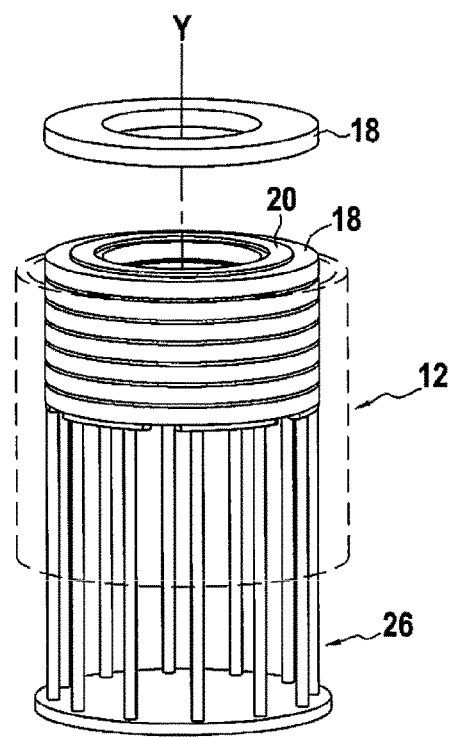
Figure 4D:
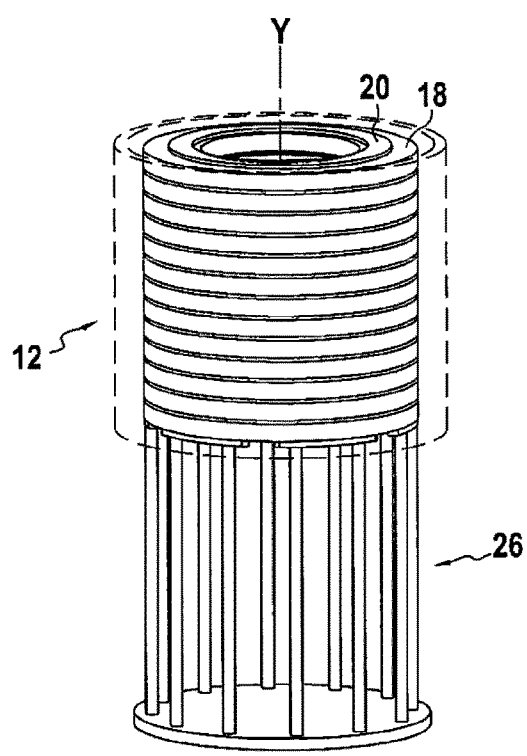

The stack of substrates 18 can then begin to be formed on the arms 30, and more precisely on the stack support elements 32. In the example shown, the loading device 26 is lowered as a substrate 18 is added to the stack (FIGS. 4C and 4D). Alternatively, the stack of substrates 18 could be formed while the loading device 26 is stationary.

Figure 4E:
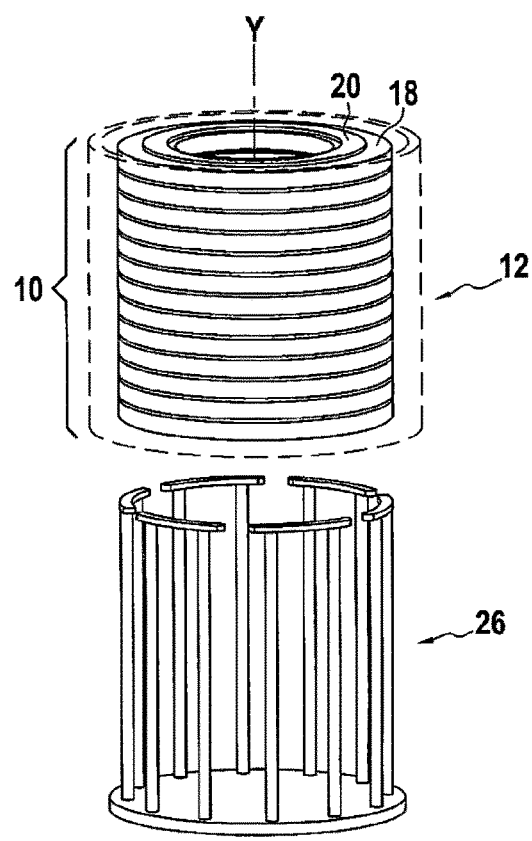

Finally, the unit module 10, consisting of the structural part 12 and the stack of substrates 18, and possibly shims 20, can be removed from the loading device 26 (FIG. 4E).

FIG. 5 schematically shows the loading of substrates 18 into the chamber 34 of a densification furnace obtained after forming stacks of unit modules 10. The chamber 26 is shown schematically as a dotted line. The substrate load 18 comprises a plurality of stacks of unit modules 10, in this example fourteen stacks are present in the chamber 26. Each stack of unit modules 10 comprises, in this example, seven unit modules 10.

To stack a second unit module 10 on a first unit module 10, the support plate 14 of the second unit module 10 is placed on the last shim 20 and the free end 16b of the cylinder 16 of the first unit module 10 below by centring the modules 10 along the same axis Y. The cylinder 16 of the first unit module 10 is thus in contact with the support plate 14 of the second unit module 10 so as to take up the mass of the latter. One or more seals may be present on the lower surface of a support plate 14 intended to be in contact with a free end 16b of a cylinder and/or on the free end of the cylinder 16b intended to be in contact with a support plate 14.

In a stack of unit modules 10, the internal volumes 17 are in communication through the inlet openings 14a so as to form a central duct that allows a gas to be conveyed over the entire height of the stack. The external volumes 19 are also in communication through the outlet openings 14b so as to form a peripheral duct that allows the gases that have passed through the substrates 18 to be discharged.

Each stack of unit modules 10 is surmounted by a cover 22 (FIGS. 5 and 6) that closes the central duct. Each cover 22 comprises gas outlet openings 22a in communication with the peripheral duct to allow the gases from the chamber 34 to be discharged.

At the base of each stack of unit modules 10, a unit module 10 is in contact with a bottom 34a of the chamber 34 so that its central inlet opening 14a is in communication with a gas inlet 36 provided in the bottom 34a and the outlet openings 14b of this unit module 10 are obstructed. There are, in this example, as many gas inlets 36 as there are stacks of unit modules 10 in the chamber 34.

The chamber 34 comprises a heated wall 34b which here constitutes a susceptor laterally delimiting the chamber 34. More precisely, the wall 34b is here an armature which is inductively coupled with an inductor 38 present around the chamber 34. In the example shown, the loading of porous substrates 18 is adapted to the cylindrical shape of the chamber 34 around the axis X. In particular, the stacks of unit modules 10 are distributed in the chamber 10 around the axis X.

Once the loading has been completed, a gas phase (or reactive gas) containing one or more carbon precursor constituents is introduced into the chamber 34 through the gas inlets 36. The introduced gas phase is conveyed, for each stack, to the central gas inlet opening 14a of the first unit module 10 of the stack. The gas phase then arrives in the internal volumes 17 formed by the central passages 18a of the substrates 18. The relatively large pressure difference between the central duct of each stack (corresponding to the union of the internal volumes 17) and the peripheral duct (corresponding to the union of the external volumes 19) ensures that the gas phase passes through the substrates 18 to densify them. Once the gas phase has passed through the substrates 18, it reaches the peripheral duct and can then be discharged through the outlet openings 22a of the cover 22. The gases discharged through the outlet openings 22a of the cover 22 can finally be recovered through an outlet opening (not shown) provided in an upper wall of the chamber 34, which may optionally be associated with suction means.

Typically, the gas phase comprises a carrier gas and one or more matrix gas precursors. To form a carbonaceous matrix, methane, propane, or a mixture of the two can be used as gas precursors. The carrier gas can be natural gas.

The invention claimed is:

1. A process for densifying annular porous substrates by chemical vapour infiltration, the process comprising:
    providing a plurality of unit modules, each unit module comprising a support plate on which is formed a stack of annular porous substrates, the support plate comprising a central gas inlet opening communicating with an internal volume formed by the central passages of the stacked substrates and gas outlet openings angularly distributed around the central opening, and a thermal mass cylinder wrapping the stack of substrates having a first end integral with the support plate and a second free end so that a closed peripheral duct is formed between the stacked substrates and the cylinder,
    forming stacks of unit modules in the chamber of a densification furnace, each stack comprising at least one second unit module stacked on a first unit module, the support plate of the second unit module resting on the second free end of the cylinder of the first unit module, the central gas inlet opening of the second unit module communicating with the internal volume of the stack of substrates of the first unit module, and the peripheral duct of the second unit module communicating with the peripheral duct of the first unit module via the gas outlet openings of the second unit module, and injecting into the stacks of unit modules a gas phase comprising a gas precursor of a matrix material to be deposited within the porosity of the substrates, wherein, to form a stack of annular porous substrate on the support plate of a unit module, arms of a loading device are inserted into the unit module through the outlet openings of the support plate, the stack of substrates is formed on the ends of the arms inserted into the unit module, and the arms are removed from the unit module so as to deposit the stack thus formed on the support plate.

2. The process as claimed in claim 1, wherein each cylinder is made of graphite.

3. The process as claimed in claim 1, wherein each unit module comprises shims between the porous substrates, each shim providing a leakage passage between the internal volume of the stack of substrates and the external volume to the stack of substrates.

4. The process as claimed in claim 1, wherein each support plate is circular in shape and has a diameter comprised between 110% and 120% of the outer diameter of an annular porous substrate.

5. The process as claimed in claim 1, wherein the chamber of the densification furnace is delimited by a susceptor coupled to an inductor.

6. The process as claimed in claim 1, wherein each annular porous substrate comprises carbon.

7. The process as claimed in claim 1, wherein each annular porous substrate constitutes a fibrous preform for a brake disc.

8. The process as claimed in claim 1, wherein the arms are vertical arms and wherein the loading device comprises a disc-shaped lower plate from which the vertical arms extend.

9. The process as claimed in claim 1, wherein the gas outlet openings of the second unit module communicate directly with the external volume to the stack of substrates of the first unit module.

10. The process as claimed in claim 1, wherein the external volume to the stack of substrates of the first unit module, the gas outlet openings of the second unit module and an external volume to the stack of substrates of the second unit module collectively form a gas channel.

11. The process as claimed in claim 1, wherein each of the gas outlet openings extends through an entire thickness of the support plate.

* * * * *